(12) United States Patent
Oki et al.

(10) Patent No.: US 11,032,945 B2
(45) Date of Patent: Jun. 8, 2021

(54) HEAT SHIELD ASSEMBLY FOR AN EPITAXY CHAMBER

(71) Applicant: Applied Materials, Inc., Santa Clara, CA (US)

(72) Inventors: Shinichi Oki, Chiba-Ken (JP); Yoshinobu Mori, Tokyo (JP)

(73) Assignee: Applied Materials, Inc., Santa Clara, CA (US)

( * ) Notice: Subject to any disclaimer, the term of this patent is extended or adjusted under 35 U.S.C. 154(b) by 87 days.

(21) Appl. No.: 16/566,055

(22) Filed: Sep. 10, 2019

(65) Prior Publication Data

US 2021/0015004 A1 Jan. 14, 2021

Related U.S. Application Data

(60) Provisional application No. 62/873,832, filed on Jul. 12, 2019.

(51) Int. Cl.
| | | |
|---|---|---|
| *H01L 21/67* | (2006.01) | |
| *H05K 7/20* | (2006.01) | |
| *C23C 16/48* | (2006.01) | |

(52) U.S. Cl.
CPC ......... *H05K 7/20409* (2013.01); *C23C 16/48* (2013.01); *H01L 21/67248* (2013.01)

(58) Field of Classification Search
CPC .............. H05K 7/20409; C23C 16/48; H01L 21/67248
USPC ........................ 118/715; 156/345.33, 345.34
See application file for complete search history.

(56) References Cited

U.S. PATENT DOCUMENTS

| | | | | |
|---|---|---|---|---|
| 3,750,620 A | * | 8/1973 | Eversteijn | ............... C30B 25/14 118/725 |
| 4,558,660 A | * | 12/1985 | Nishizawa | ............ C30B 25/105 118/50.1 |
| 4,651,673 A | * | 3/1987 | Muething | ............... C30B 25/14 118/715 |

(Continued)

FOREIGN PATENT DOCUMENTS

| | | | |
|---|---|---|---|
| JP | 61279120 A | * | 12/1986 |
| JP | 2002231641 A | * | 8/2000 |

(Continued)

OTHER PUBLICATIONS

International Search Report and Written Opinion from PCT/US2020/036278 dated Sep. 22, 2020.

*Primary Examiner* — Rudy Zervigon
(74) *Attorney, Agent, or Firm* — Patterson + Sheridan, LLP

(57) ABSTRACT

Disclosed herein is a heat shield assembly for a processing chamber. The processing chamber includes a body having sidewalls, a bottom and a lid that define an interior volume. The heat shield assembly is disposed in the interior volume, and includes a heat shield and a preheat member. The preheat member includes an inner circumference, and is positioned below the heat shield. A susceptor is disposed in the interior volume and configured to support a substrate, and is positioned within the inner circumference of the preheat member. An opening is positioned between the susceptor and the preheat member. A first section of the opening is proximate to a gas inlet, and is covered by the heat shield. A second section of the annular opening is proximate a gas outlet, and is not covered by the heat shield member.

18 Claims, 6 Drawing Sheets

(56) References Cited

U.S. PATENT DOCUMENTS

| | | | | |
|---|---|---|---|---|
| 4,753,192 A * | 6/1988 | Goldsmith | C23C 8/00 118/715 |
| 4,836,138 A * | 6/1989 | Robinson | C23C 16/481 118/666 |
| 4,849,608 A * | 7/1989 | Muraoka | C30B 25/10 219/390 |
| 4,975,561 A * | 12/1990 | Robinson | C23C 16/481 219/390 |
| 4,976,996 A * | 12/1990 | Monkowski | C23C 16/455 118/719 |
| 4,993,360 A * | 2/1991 | Nakamura | C23C 16/45582 118/715 |
| 5,077,875 A * | 1/1992 | Hoke | C30B 25/02 118/715 |
| 5,244,501 A * | 9/1993 | Nakayama | C23C 16/455 118/50.1 |
| 5,252,132 A * | 10/1993 | Oda | C23C 16/481 118/715 |
| 5,370,738 A * | 12/1994 | Watanabe | C23C 16/455 118/715 |
| 5,411,590 A * | 5/1995 | Hawkins | C23C 16/455 118/715 |
| 5,421,288 A * | 6/1995 | Ohta | C23C 16/455 117/84 |
| 5,861,609 A * | 1/1999 | Kaltenbrunner | H01L 21/2686 118/50.1 |
| 5,891,350 A * | 4/1999 | Shan | H01J 37/32477 118/723 E |
| 6,021,152 A * | 2/2000 | Olsen | C23C 14/12 372/99 |
| 6,075,922 A * | 6/2000 | Tay | F26B 21/10 392/416 |
| 6,093,252 A * | 7/2000 | Wengert | H01L 21/68785 118/719 |
| 6,099,648 A | 8/2000 | Anderson | |
| 6,111,225 A | 8/2000 | Ohkase et al. | |
| 6,190,457 B1 * | 2/2001 | Arai | C23C 16/455 438/478 |
| 6,191,392 B1 * | 2/2001 | Hauf | G01J 5/0003 219/411 |
| 6,214,116 B1 * | 4/2001 | Shin | C23C 16/45504 118/640 |
| 6,218,212 B1 * | 4/2001 | Saito | C23C 16/306 438/93 |
| 6,261,408 B1 * | 7/2001 | Schneider | C23C 16/4412 118/715 |
| 6,281,141 B1 * | 8/2001 | Das | H01L 29/518 438/770 |
| 6,331,212 B1 * | 12/2001 | Mezey, Sr. | H01L 21/67109 118/724 |
| 6,531,069 B1 * | 3/2003 | Srivastava | H01J 37/3244 118/723 R |
| 6,544,869 B1 * | 4/2003 | Harafuji | C23C 16/45582 438/478 |
| 6,568,346 B2 * | 5/2003 | Pu | H01J 37/321 118/723 I |
| 6,592,674 B2 * | 7/2003 | Sakai | C23C 16/455 118/715 |
| 6,663,714 B2 * | 12/2003 | Mizuno | C23C 16/45521 118/719 |
| 6,666,921 B2 * | 12/2003 | Sakai | C23C 16/455 118/715 |
| 6,709,267 B1 * | 3/2004 | Hawkins | C23C 16/4585 118/500 |
| 6,820,570 B2 * | 11/2004 | Kilpela | C23C 16/4412 118/723 E |
| 6,963,043 B2 * | 11/2005 | Fink | H01J 37/32642 118/723 R |
| 7,020,981 B2 * | 4/2006 | Shero | C23C 16/4412 118/715 |
| 7,118,781 B1 * | 10/2006 | Sumakeris | C23C 16/4401 427/248.1 |
| 7,311,784 B2 * | 12/2007 | Fink | H01J 37/32642 118/723 E |
| 7,416,677 B2 * | 8/2008 | Takahashi | H01J 37/32844 216/71 |
| 7,699,934 B2 * | 4/2010 | Kai | C30B 25/14 118/728 |
| 7,709,398 B2 * | 5/2010 | Strauch | C23C 16/303 438/758 |
| 8,012,305 B2 * | 9/2011 | Takahashi | H01J 37/32844 156/345.28 |
| 8,067,061 B2 * | 11/2011 | Aggarwal | C23C 16/4583 427/248.1 |
| 8,075,728 B2 * | 12/2011 | Balakrishna | H01J 37/3244 156/345.26 |
| 8,349,083 B2 * | 1/2013 | Takasuka | C30B 29/403 118/715 |
| 8,349,403 B2 * | 1/2013 | Takasuka | C23C 16/455 427/248.1 |
| 8,470,694 B2 * | 6/2013 | Tanaka | H01L 21/0254 438/478 |
| 8,628,616 B2 * | 1/2014 | Takasuka | C23C 16/4401 118/715 |
| 8,663,390 B2 * | 3/2014 | Carlson | C23C 16/455 118/724 |
| 8,726,837 B2 * | 5/2014 | Patalay | H01L 21/67259 118/713 |
| 8,771,417 B2 * | 7/2014 | Yoon | H01J 37/32357 118/715 |
| 8,790,489 B2 * | 7/2014 | Honda | H01L 21/6719 156/345.29 |
| 8,888,087 B2 * | 11/2014 | Okabe | C23C 16/4584 269/289 R |
| 8,906,162 B2 * | 12/2014 | Ueno | C30B 35/00 118/725 |
| 8,920,565 B2 * | 12/2014 | Ueno | C30B 25/08 118/725 |
| 8,980,005 B2 * | 3/2015 | Carlson | C23C 16/45574 118/715 |
| 9,096,949 B2 * | 8/2015 | Okabe | H01L 21/6719 |
| 9,322,097 B2 * | 4/2016 | Aboagye | C23C 16/4411 |
| 9,410,248 B2 * | 8/2016 | Kools | C23C 16/4412 |
| 9,487,863 B2 * | 11/2016 | Matsui | C23C 16/4408 |
| 9,499,905 B2 * | 11/2016 | Samir | C23C 16/45568 |
| 9,553,002 B2 * | 1/2017 | Samir | H01L 21/67017 |
| 9,663,873 B2 * | 5/2017 | Okabe | C30B 25/08 |
| 9,695,508 B2 * | 7/2017 | Carlson | C23C 16/45574 |
| 9,768,043 B2 * | 9/2017 | Chang | H01L 21/67115 |
| 9,845,550 B2 * | 12/2017 | Brillhart | H01L 21/67115 |
| 9,856,580 B2 * | 1/2018 | Sanchez | C30B 25/08 |
| 9,870,919 B2 * | 1/2018 | Ranish | H01L 21/0262 |
| 9,870,937 B2 * | 1/2018 | Moslehi | C23C 16/481 |
| 9,879,358 B2 * | 1/2018 | Oki | C23C 16/4585 |
| 10,072,354 B2 * | 9/2018 | Okabe | C30B 29/06 |
| 10,221,479 B2 * | 3/2019 | Kools | C23C 16/45591 |
| 10,276,405 B2 * | 4/2019 | Miyata | H01J 37/32449 |
| 10,443,129 B2 * | 10/2019 | Mori | C23C 16/4585 |
| 10,458,040 B2 * | 10/2019 | Brillhart | C30B 25/08 |
| 10,544,518 B2 * | 1/2020 | Oki | C23C 16/4558 |
| 10,619,240 B2 * | 4/2020 | Wang | C23C 14/04 |
| 10,643,826 B2 * | 5/2020 | Kim | C23C 16/46 |
| 10,691,145 B2 * | 6/2020 | Bauer | C23C 16/4408 |
| 10,697,062 B2 * | 6/2020 | Kao | C23C 16/4412 |
| 10,752,991 B2 * | 8/2020 | Shono | C30B 25/14 |
| 10,763,138 B2 * | 9/2020 | Kim | F16K 3/06 |
| 2002/0038791 A1 * | 4/2002 | Okumura | H01J 37/3244 216/71 |
| 2002/0042191 A1 * | 4/2002 | Sakai | C23C 16/455 438/479 |
| 2002/0160112 A1 * | 10/2002 | Sakai | C30B 25/14 427/255.28 |
| 2003/0075273 A1 * | 4/2003 | Kilpela | C23C 16/45565 156/345.33 |
| 2004/0040664 A1 * | 3/2004 | Yang | H01L 21/68785 156/345.51 |
| 2004/0040940 A1 * | 3/2004 | Fink | H01J 37/32642 219/121.43 |

(56) References Cited

U.S. PATENT DOCUMENTS

| | | | | |
|---|---|---|---|---|
| 2004/0216665 A1* | 11/2004 | Soininen | C23C 16/4412 | 118/715 |
| 2005/0098107 A1* | 5/2005 | Du Bois | H01L 21/67757 | 118/715 |
| 2005/0167052 A1* | 8/2005 | Ishihara | H01J 37/32633 | 156/345.47 |
| 2005/0269030 A1* | 12/2005 | Kent | H01L 21/67751 | 156/345.31 |
| 2007/0101939 A1* | 5/2007 | Sumakeris | C23C 16/455 | 118/724 |
| 2007/0266945 A1* | 11/2007 | Shuto | H01J 37/32091 | 118/723 E |
| 2007/0281084 A1* | 12/2007 | Hirosawa | C23C 16/45565 | 427/248.1 |
| 2008/0035605 A1* | 2/2008 | Takahashi | H01J 37/32844 | 216/58 |
| 2008/0092812 A1* | 4/2008 | McDiarmid | H01L 21/67017 | 118/695 |
| 2008/0295964 A1* | 12/2008 | Takahashi | H01J 37/32844 | 156/345.28 |
| 2009/0194018 A1* | 8/2009 | Higashi | C30B 25/12 | 117/98 |
| 2010/0204810 A1* | 8/2010 | Saito | H01J 37/32834 | 700/90 |
| 2010/0307415 A1* | 12/2010 | Shero | C23C 16/45502 | 118/715 |
| 2011/0227037 A1* | 9/2011 | Su | C30B 29/406 | 257/13 |
| 2012/0000886 A1* | 1/2012 | Honda | H01J 37/32633 | 216/24 |
| 2013/0014698 A1* | 1/2013 | Kools | C23C 16/45561 | 118/715 |
| 2013/0019803 A1* | 1/2013 | Samir | C23C 16/4558 | 118/725 |
| 2013/0284288 A1* | 10/2013 | Kim | H01J 37/32834 | 137/526 |
| 2014/0116340 A1* | 5/2014 | Mori | C23C 16/481 | 118/725 |
| 2014/0261159 A1* | 9/2014 | Okabe | C30B 25/12 | 117/98 |
| 2014/0261185 A1* | 9/2014 | Aboagye | C23C 16/45563 | 118/728 |
| 2014/0290573 A1* | 10/2014 | Okabe | H01L 21/68742 | 118/500 |
| 2015/0020734 A1* | 1/2015 | Ye | C23C 16/45591 | 118/715 |
| 2015/0047566 A1* | 2/2015 | Sanchez | C30B 25/14 | 118/725 |
| 2015/0122181 A1* | 5/2015 | Okabe | C23C 16/4584 | 118/729 |
| 2015/0252492 A1* | 9/2015 | Okabe | C30B 25/165 | 220/669 |
| 2015/0252493 A1* | 9/2015 | Okabe | C30B 29/06 | 118/715 |
| 2016/0068959 A1* | 3/2016 | Lau | C23C 16/458 | 118/722 |
| 2016/0068997 A1* | 3/2016 | Lau | C30B 35/00 | 239/132 |
| 2016/0071749 A1* | 3/2016 | Lau | C23C 16/4412 | 432/247 |
| 2016/0172217 A1* | 6/2016 | Miyata | H01J 37/32834 | 156/345.29 |
| 2016/0281261 A1* | 9/2016 | Oki | F24C 15/10 | |
| 2016/0281262 A1* | 9/2016 | Oki | C23C 16/4585 | |
| 2016/0281263 A1* | 9/2016 | Oki | C23C 16/45502 | |
| 2016/0348275 A1* | 12/2016 | Oki | C30B 25/12 | |
| 2018/0005856 A1* | 1/2018 | Chang | H01L 21/67115 | |
| 2018/0084610 A1 | 3/2018 | Lo et al. | | |
| 2018/0209043 A1* | 7/2018 | Lau | C23C 16/45563 | |
| 2018/0327904 A1* | 11/2018 | Dempoh | C23C 16/45504 | |
| 2019/0062904 A1* | 2/2019 | Hawrylchak | C23C 16/0245 | |
| 2019/0066998 A1* | 2/2019 | Hawrylchak | H01J 37/32899 | |
| 2019/0093254 A1* | 3/2019 | Okabe | C30B 25/08 | |
| 2019/0127851 A1* | 5/2019 | Lau | B23K 26/032 | |
| 2020/0071832 A1* | 3/2020 | Lau | C23C 16/4583 | |

FOREIGN PATENT DOCUMENTS

| | | |
|---|---|---|
| JP | 2013138114 A | 7/2013 |
| JP | 2016184733 A | 10/2016 |
| JP | 2016184734 A | 10/2016 |

* cited by examiner

HEAT SHIELD ASSEMBLY FOR AN EPITAXY CHAMBER

CROSS-REFERENCE TO RELATED APPLICATIONS

This application claims benefit of U.S. Provisional Patent Application Ser. No. 62/873,832, filed Jul. 12, 2019, the contents of which are hereby incorporated by reference in its entirety.

BACKGROUND

Field of Endeavor

Examples of the present disclosure generally relate to an apparatus for semiconductor processing. More specifically, examples described herein relate to a heat shield assembly for an epitaxy chamber.

Description of the Related Art

Epitaxy is a process commonly used in semiconductor processing to fabricate high quality materials with extremely uniform electrical properties for semiconductor devices. As semiconductor devices have grown smaller, and manufacturing units have grown larger, uniformity across a single manufactured substrate becomes more important.

In an epitaxy chamber, process gases flow across a substrate from one side of the chamber to the other side where the gases are removed. The substrate may be configured to rotate during processing to minimize the effect of non-uniformities, but persistent non-uniformities may nonetheless manifest as radial variations. The epitaxy chamber can include a heat shield assembly that circumnavigates a susceptor. The heat shield assembly can absorb heat from heating elements below the susceptor and re-radiates that heat above the heat shield assembly.

During substrate processing within the epitaxy chamber, residue materials, such as gaseous precursors and their reaction byproducts, can undesirably deposit material on one or more interior surfaces in the epitaxy chamber. The thickness of the deposits can increase with every substrate processed. As the thickness of the residual material deposits grow, the deposits eventually flake from the epitaxy processing chamber surfaces leading to undesirable particulate contamination in the processing volume. The particulate contamination can negatively affect the quality of the material layer deposited on the substrate. Therefore, epitaxy chambers must be periodically cleaned to remove residue material therefrom. Epitaxy processing chamber cleaning includes one or both of periodic cleaning cycles between substrate processing operations, and opening the chamber for cleaning and scheduled maintenance. Such cleaning and maintenance result in lower substrate throughput and increased chamber downtime. As such, this cleaning and maintenance can cause lost productivity for the processing chamber.

Accordingly, there is a need in the art to reduce chamber contamination and downtime in epitaxial processing chambers.

SUMMARY

Disclosed herein is a heat shield assembly for a processing chamber. The processing chamber includes a chamber body having sidewalls, a bottom and a lid defining an interior volume of the chamber body. A heat shield assembly is disposed in the interior volume. The heat shield assembly includes a heat shield member and an annular preheat member. The annular preheat member includes an inner circumference. The annular preheat member is positioned below the annular heat shield. A susceptor is disposed in the interior volume and configured to support a substrate. The susceptor is positioned within the inner circumference of the annular preheat member. An annular opening is positioned between the susceptor and the annular preheat member. A first section of the annular opening is proximate to a gas inlet. The first section is covered by the heat shield member. A second section of the annular opening is proximate a gas outlet. The second section of the annular opening is not covered by the heat shield member.

Another example of the processing chamber includes a chamber body having sidewalls, a bottom and a lid defining an interior volume of the chamber body. A heat shield assembly is disposed in the interior volume. The heat shield assembly includes a heat shield member. The heat shield assembly also includes an annular preheat member that has an inner circumference. The annular preheat member is positioned below the annular heat shield. A susceptor is disposed in the interior volume and is configured to support a substrate. The susceptor is positioned within the inner circumference of the annular preheat member. An annular opening is positioned between the susceptor and the annular preheat member. A first section of the annular opening is proximate a gas inlet. The first section is covered by the heat shield member. An arc-shaped aperture of the annular opening is proximate a gas outlet. The arc-shaped aperture is not covered by the heat shield member. A position of the arc-shaped aperture within the processing chamber influences a coating on the bottom side of the susceptor or the sidewalls of the processing chamber.

In yet another example, a processing chamber includes a chamber body that has sidewalls, a bottom and a lid that define an interior volume of the chamber body. A heat shield assembly is disposed in the interior volume. The heat shield assembly includes a heat shield member and an annular preheat member. The annular preheat member includes an inner circumference. The annular preheat member is positioned below the annular heat shield. A susceptor is disposed in the interior volume and is configured to support a substrate. The susceptor is positioned within the inner circumference of the annular preheat member. An annular opening is positioned between the susceptor and the annular preheat member. A first section of the annular opening is proximate a gas inlet. The first section is covered by the heat shield member. A second section of the annular opening is proximate a gas outlet. The second section is not covered by the heat shield member. The position of the annular opening with respect to the gas outlet influences a coating on an upper dome or lower dome of the processing chamber.

BRIEF DESCRIPTION OF THE DRAWING

So that the manner in which the above recited features of the present disclosure can be understood in detail, a more particular description of the disclosure, briefly summarized above, may be had by reference to examples herein, some of which are illustrated in the appended drawings. It is to be noted, however, that the appended drawings illustrate only examples and are therefore not to be considered limiting of its scope, and may admit to other equally effective examples.

In order to facilitate understanding, identical reference numerals have been used, where possible, to designate identical elements that are common features. It is contemplated that elements and features of one example may be beneficially incorporated into other examples without further recitation.

DETAILED DESCRIPTION

Disclosed herein is a heat shield assembly for a processing chamber. Examples of the processing chamber include a chamber body having sidewalls, a bottom and a lid defining an interior volume of the chamber body. Disposed within the internal volume is a substrate support and the heat shield assembly. The heat shield assembly includes a heat shield member and an annular preheat member. An annular opening is formed between the substrate support and the annular preheat member.

A portion of the annular opening is not overlapped by the heat shield member. The position of the non-overlapped portion of the annular opening with respect to a gas inlet and a gas outlet influences a coating of deposition material on surfaces within the internal volume. More specifically, positioning the heat shield member distally from the gas outlet reduces the coating of deposition material on the substrate support, on the upper dome surfaces and lower dome surfaces of the processing chamber. Because the position of the annular opening reduces the deposition of material on surfaces within the interior volume of the processing chamber, a maintenance cycle for cleaning the surfaces within the interior volume of the processing chamber is lengthened or improved. The reduction in deposition material on the upper and lower dome and substrate support enables longer intervals between performing in situ cleaning cycles for the interior volume. By reducing periodic maintenance and having longer cycles between in situ cleaning, a higher throughput is achieved. The examples disclosed herein additionally enable improved process stability by reducing the undesirable coating within the chamber. Accordingly, the cost of ownership for the processing chamber is reduced as the mean time between service intervals is extended.

In this disclosure, the terms "top", "bottom", "side", "above", "below", "up", "down", "upward", "downward", "horizontal", "vertical", and the like do not refer to absolute directions. Instead, these terms refer to directions relative to a basis plane of the chamber, for example a plane parallel to a surface of the substrate of the processing chamber.

Figure 1:
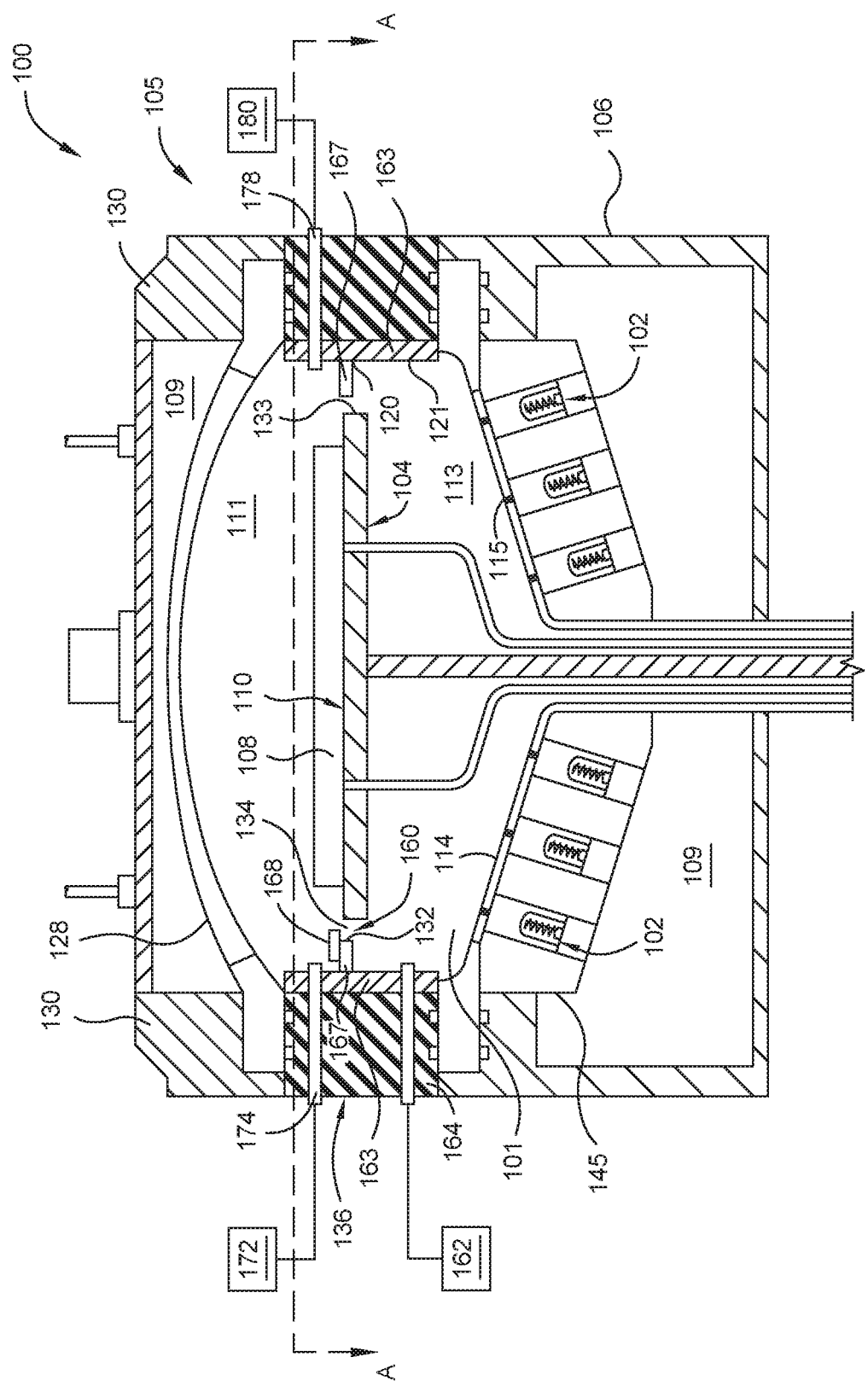
FIG. 1 is a schematic cross-sectional view of a processing chamber having a heat shield assembly according to an embodiment.

FIG. 1 is a schematic cross-sectional view of a processing chamber 100 having a heat shield assembly 160. The processing chamber 100 has a chamber body 105. The chamber body 105 includes sidewalls 136, a bottom 106, and a lid 130 that define an enclosure 109 of the chamber body 105. An upper dome 128, lower dome 114, and liners 163 are disposed in the enclosure 109. The liners 163 are affixed to the sidewalls 136. An internal volume 101 of the chamber body 105 is defined by the upper dome 128, the lower dome 114, and the liners 163. The internal volume 101 includes a processing volume 111 and a purge volume 113.

A process gas inlet 174 is formed through the sidewalls 136 of the processing chamber 100. The process gas inlet 174 is also formed through the liner 163 and provides a pathway to flow process gases into the processing volume 111. Process gases flow from a gas source 172 through the process gas inlet 174 and across a substrate support 104 disposed within the internal volume 101 of the processing chamber 100.

A purge gas inlet 164 is coupled to a purge gas source 162. The purge gas inlet 164 is also formed through the liner 163 and provides a pathway to flow purge gases into the purge volume 113. Purge gases flow from the purge gas source 162 through the purge gas inlet 164.

A gas outlet 178 is disposed through the sidewall 136 and the liner 163 is substantially opposite the process gas inlet 174 in the internal volume 101 of the processing chamber 100. The gas outlet 178 enables process gases in the processing volume 111 of the internal volume 101 to be evacuated from the processing chamber 100. Purge gases within the purge volume 113 of the internal volume 101 are evacuated from the processing chamber 100 through the gas outlet 178. A vacuum source 180 is coupled to the gas outlet 178 to evacuate the process and purge gases from the internal volume 101 of the processing chamber 100.

The substrate support 104 is configured to support a substrate 108 disposed on an upper surface 110 of the substrate support 104 during processing operations in the processing chamber 100. The substrate support 104 may rotate the substrate 108 during processing to improve the uniformity of material deposited on the substrate 108. The upper dome 128 is disposed above the substrate support 104 and together with the upper surface 110 of the substrate support 104 and the liner 163 further define the processing volume 111. The purge volume 113 is further defined by the lower dome 114, a bottom surface (not shown) of the substrate support 104, and the liner 163.

A heat module 145 provides heat to the processing chamber 100 during processing. The heat module 145 may be positioned above or below the substrate support 104. In the processing chamber 100 illustrated in FIG. 1, the heat module 145 is provided below the substrate support 104. The heat module 145 may include optical elements 115, such as lenses, light pipes, or other reflective and refractive elements. The heat module 145 includes a plurality of heat sources 102. The plurality of heat sources 102 is disposed within the lower dome 114. The heat sources 102 may be any combination of lamps, light emitting diodes (LEDs), and lasers. The reflective and refractive elements are individually shaped to direct the energy emitted by the heat source 102 toward the substrate support 104. The heat from the heat module 145 heats the substrate support 104, which transfers heat to the substrate 108 by conduction where the substrate 108 is in contact with the substrate support 104. In some cases, heat may also be transferred by radiation, for example where the substrate 108 does not contact the substrate support 104.

The heat shield assembly 160 surrounds the substrate support 104. The heat shield assembly 160 is an annular or ring-like structure concentric with the substrate support 104. An outer radius 120 of the heat shield assembly 160 is less than an inner radius 121 of the liner 163, such that the heat shield assembly 160 fits within the inner radius of the liner 163.

The heat shield assembly 160 includes the annular preheat member 167 and a heat shield member 168. The annular preheat member 167 is annular or ring shaped. The annular preheat member 167 has an inner radius 132 that is larger than an outer radius 133 of the substrate support 104. The heat shield member 168 is shaped like a sector of an annular ring, i.e., arc shaped. The heat shield member 168 has edges (236 in FIG. 2.) which define the ends of the sector. An annular opening 134 is disposed between the annular preheat member 167 and the substrate support 104. As described in further details below, the heat shield member 168 vertically overlaps a portion of the annular opening 134.

Figure 2:
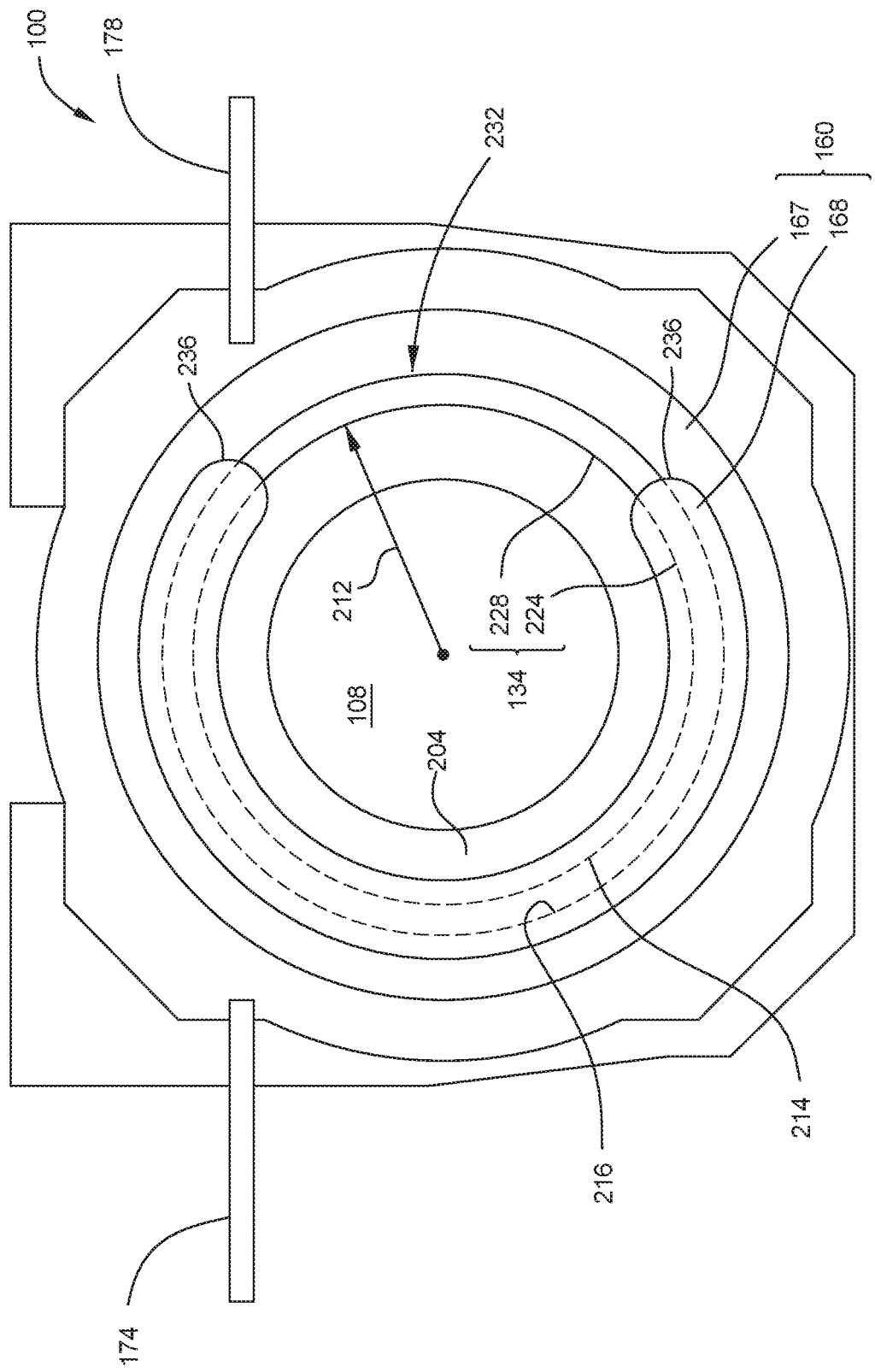
FIG. 2 is a plan view of the processing chamber, as viewed along section line A-A in FIG. 1, according to an embodiment.

FIG. 2 is a plan view of the processing chamber 100, as viewed along section line A-A in FIG. 1. The substrate support 104 has a susceptor 204. In some examples, the susceptor 204 is integral to or part of the substrate support 104. Alternately, the susceptor 204 may be coupled to the substrate support 104 in a manner that enables the susceptor 204 to be moveably detached from the substrate support 104. The susceptor 204 has an outer circumference 214 that is defined by a radius 212. An inner circumference 216 of the annular preheat member 167 is defined by its inner radius 132. The annular opening 134 is defined by a space between the outer circumference 214 of the susceptor 204 and the inner circumference 216 of the annular preheat member 167. The annular opening 134 includes a first part 224 and a second part 228. The first part 224 of the annular opening 134 is covered by the heat shield member 168. The process gas inlet 174 is proximate the first part 224 of the annular opening 134. The second part 228 of the annular opening 134 is not covered by the heat shield member 168. The gas outlet 178 is proximate the second part 228 of the annular opening 134. The second part 228 of the annular opening 134 is an arc-shaped aperture 232. The arc-shaped aperture 232 is a space defined by the outer circumference of the susceptor 204, the inner circumference 216 of the annular preheat member 167, and the edges 236 of the heat shield member 168. Thus, the heat shield member 168 prevents direct line of sight from the processing volume 111 to the purge volume 113 through only the first part 224 of the annular opening 134.

Gases flowing from the process gas inlet 174 and purge gas inlet 164 enter the processing chamber 100 at velocity that is greater than the velocity of gases escaping through the gas outlet 178. Gases in the purge volume 113 proximate the gas outlet 178 have lower velocity and mass flow rate. Similarly, gases in the processing volume 111 proximate the gas outlet 178 have lower velocity and mass flow rate. The lower velocities and mass flow rates at the gas outlet 178 help reduce pressure variances (described below with respect to FIG. 3) across the arc-shaped aperture 232. The lower pressure variances at the annular opening 134 facilitate the uniform deposition of material on the substrate 108 in the processing volume because the decrease in pressure variance at the annular opening 134 reduces the opportunity for purge gas to enter the processing volume 111. Similarly, the reduction in pressure variance across the annular opening 134 reduces the opportunity for the processing gas to enter the purge volume 113. Thus, the pressure variance at the arc-shaped aperture 232 of the heat shield assembly 160 affects the azimuthal pressure profile of the processing gasses across the substrate 108. In this manner, the position of the arc-shaped aperture 232 reduces the unwanted deposition of material on internal surfaces of the lower dome 114, upper dome 128, and liner 163. Positioning the arc-shaped aperture 232 proximate the gas outlet 178 enables a reduction in the amount of undesired deposition materials on internal surfaces of the processing chamber 100.

Figure 3:
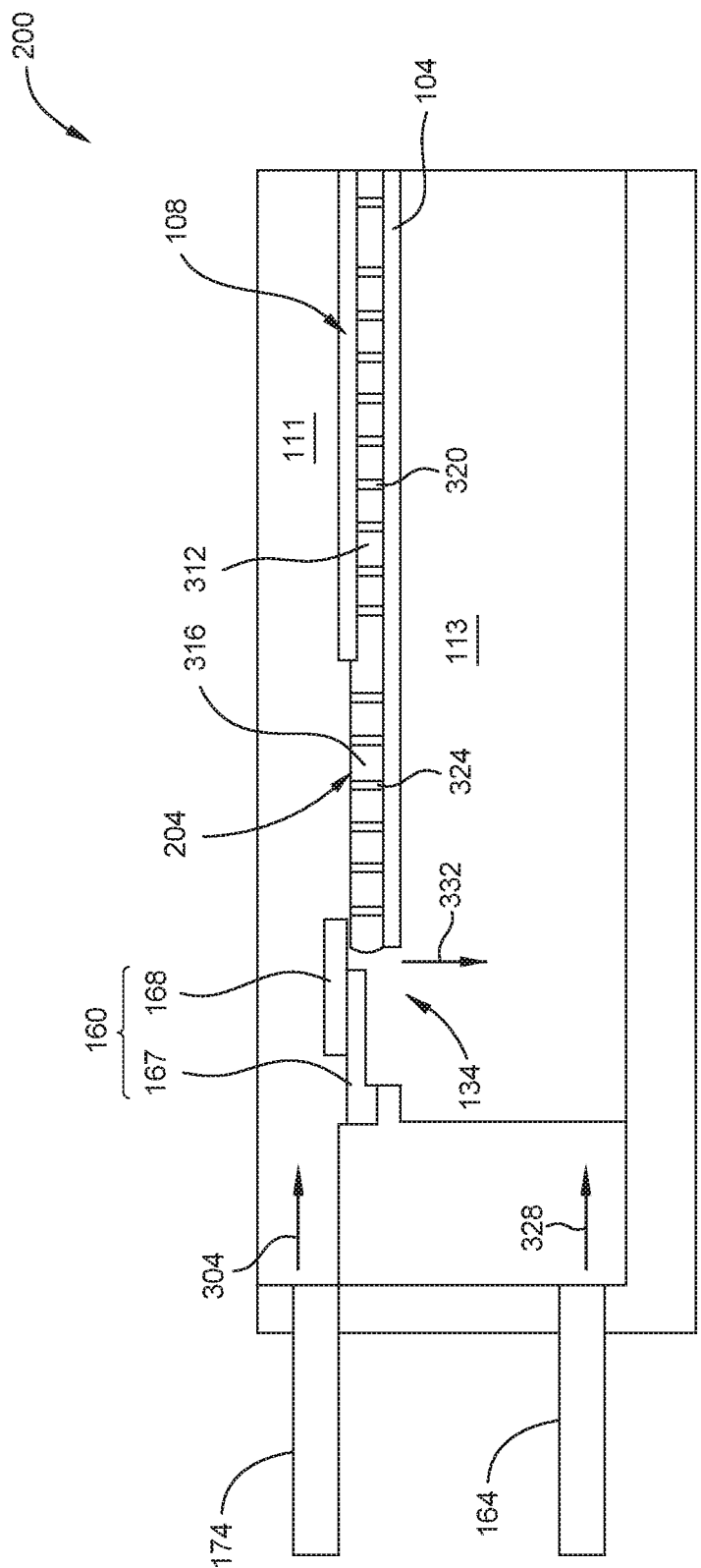
FIG. 3 is a schematic cross-sectional view of the processing chamber depicted in FIG. 1 in the vicinity of a gas inlet, according to an embodiment.

FIG. 3 is a schematic cross-sectional view of the processing chamber 100 in the vicinity of the gas inlet, depicted in FIG. 1. In some examples, the susceptor 204 can be supported by the substrate support 104. The susceptor 204 may have a recessed portion 312 having through-holes 320. The recessed portion 312 is configured to support the substrate 108 in a vertical direction. The susceptor 204 may also have a raised portion 316 that has a plurality of openings 324. The raised portion 316 of the substrate support 104 holds the substrate 108 in a lateral direction, thus preventing the substrate from sliding in a horizontal or radial direction. A diameter of each opening 324 is larger than a diameter of each through-hole 320. The raised portion 316 surrounds the substrate 108.

A process gas 304 enters the processing volume 111 from the process gas inlet 174 at a given pressure. The process gas 304 is generally drawn over the substrate 108 toward the gas outlet 178. A purge gas 328 is pressurized and enters the purge volume 113 through the purge gas inlet 164. Because the process gas 304 gas and the purge gas 328 enter the processing chamber 100 under pressure, differences in pressure may create a pressure variance 332 in the region of the annular opening 134. Moreover, because the velocities of the purge gas 328 and the process gas 304 are higher near the process gas inlet 174 and purge gas inlet 164, the mass flow rate is also increased in the area near the process gas inlet 174 and purge gas inlet 164.

The heat shield member 168 is positioned vertically above the annular opening 134 to reduce the pressure variance 332 in the area of the annular opening 134. The reduction in pressure variance 332 reduces the opportunity for purge gas 328 to enter the processing volume 111. Thus, the lower pressure variance 332 facilitates uniform deposition of material on the substrate 108 in the processing volume 111.

Figure 4:
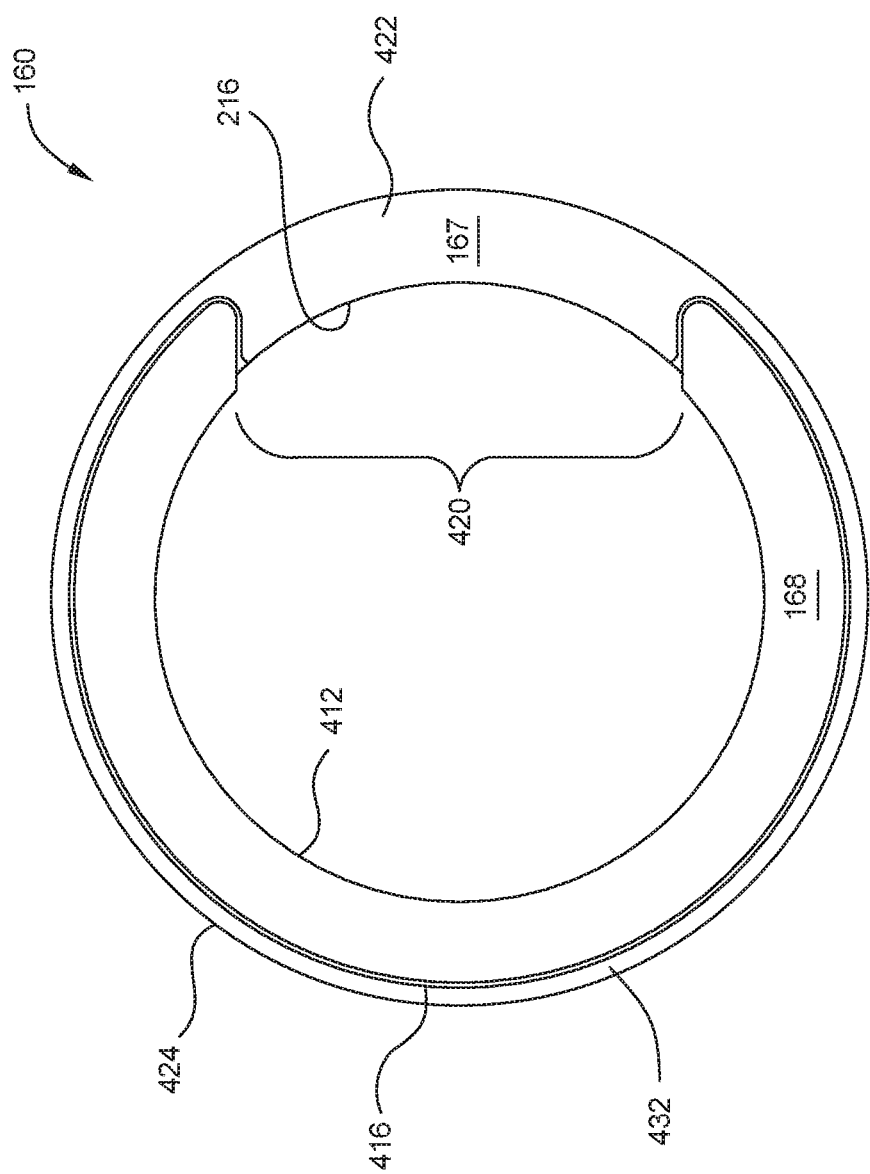
FIG. 4 is a top view of the heat shield assembly shown in the processing chamber of FIG. 1 according to an embodiment.

FIG. 4 is a top view of the heat shield assembly 160 utilized in the processing chamber of FIG. 1. The heat shield member 168 rests on the annular preheat member 167. The inner circumference 216 of the heat shield member 168 extends inward to cover the annular opening 134. Thus, the inner circumference 216 of the annular preheat member 167 is larger than the inner radius 412 of the heat shield member 168. An outer radius 410 of the annular preheat member 167 is also larger than an outer radius 424 of the heat shield member 168.

The heat shield member 168 has a gap 420 that exposes a portion 422 of the annular preheat member 167. That is, the gap 420 represents a sector which in addition to the heat shield member 168 would complete an annular ring shape. However, it should be appreciated that the gap 420 is not a segment or other shape but merely the opening in the heat shield member 168 and thus can equally be described as any shape that would be accepted through said opening in the heat shield member 168. The exposed portion 422 provides more direct heat exposure for gases flowing from the process gas inlet 174 towards the gas outlet 178, across the annular preheat member 167 to the substrate support 104 by placing exposed portion 422 proximate the gas outlet 178. Process gas 304 flowing from the process gas inlet 174 toward the gas outlet 178 are directly exposed to purge gas 328 flowing from the purge gas inlet 164 toward the gas outlet 178. The inner circumference 216 of the heat shield member 168 may be more than 150 mm to accommodate a substrate having a nominal diameter of 300 mm. For example, the inner circumference 216 may be from about 151 mm to about 155 mm for a substrate that is 300 mm in diameter. In some examples, the substrate may be 6 inches or 8 inches. Accordingly, the substrate may have a diameter from about 150 mm to about 300 mm. The gap 420 may have a dimension selected to provide a desired amount of heat exposure to gases exiting the processing chamber 100 at the gas outlet 178.

Figure 5:
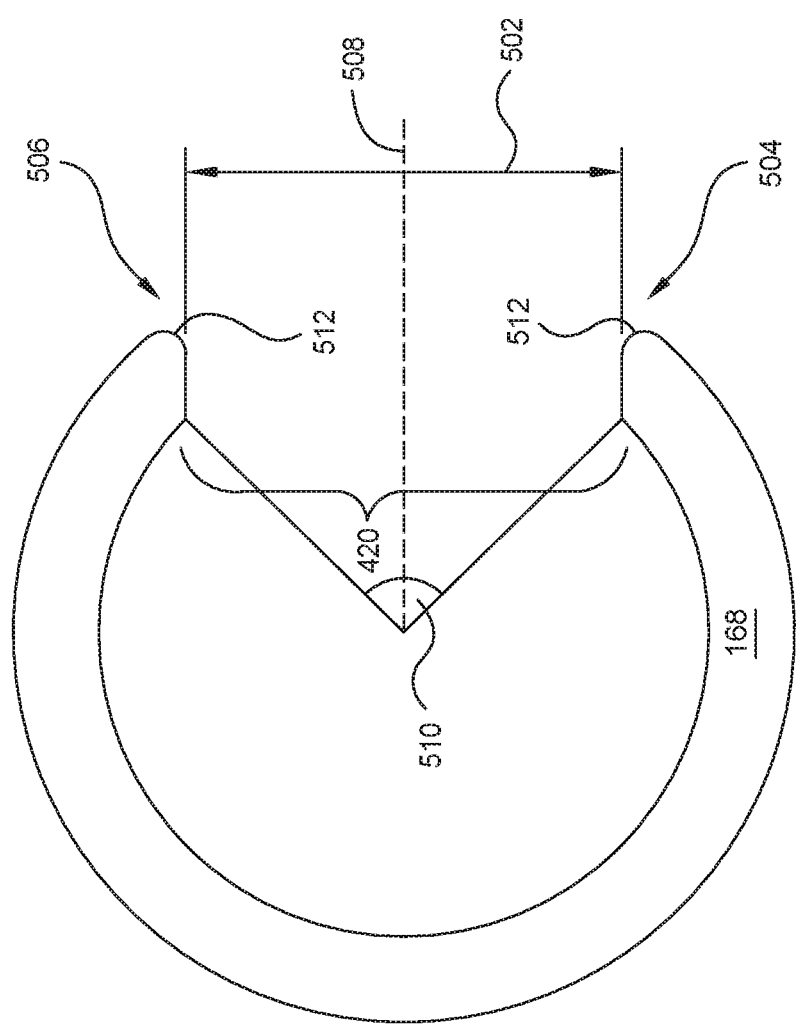
FIG. 5 is a schematic top view of a heat shield member of the heat shield assembly utilized in the processing chamber of FIG. 1 according to an embodiment.

Turning to FIG. 5, FIG. 5 is a schematic top view of the heat shield member 168 of the heat shield assembly 160 utilized in the processing chamber 100 of FIG. 1. The gap 420 is shown having a dimension 502. The dimension 502 may have a width from about 50 mm to about 180 mm. The dimension 502 of the gap 420 corresponds to the arc-shaped aperture 232 depicted in FIG. 2. Accordingly, a ratio 620 of the gap 420 to substrate radius 240 also corresponds to the uniformity of deposition thickness observed in FIG. 7 and discussed below.

The gap 420 has a first edge 504 and a second edge 506. The first edge 504 and second edge 506 of the gap 420 corresponding to the edges 236 of the heat shield member 168. The first edge 504 and the second edge 506 are generally parallel to a radial line 508 that bisects an angle 510 subtended by the gap 420. The gap 420 promotes uniform laminar flow of the process gas 304 and purge gas 328. In other examples, the edges 504 and 506 may have any desired directionality. For example, each edge 504 or 506 may be parallel to the radial line 508 that intersects with the respective edge 504 or 506. Either the first edge 504 or the second edge 506 may have a feature 512 to prevent movement of the heat shield member 168 during operation of the processing chamber 100. In another example, two outer corners of edges 504 and 506 on either side of the gap 420 have a rounded shape, i.e., the features 512. The rounded corners of the features 512 are circular, but any desired shape may be added to the corners of either edge 504 or 506. For example, the features 512 may be a chamfer of any suitable angle. The rounded corners of the features 512 have a radius of curvature of between about 0.01 mm and about 1.5 mm, such as between about 0.1 mm and about 1.0 mm, for example about 0.3 mm, 0.4 mm, or 0.5 mm.

Figure 6:
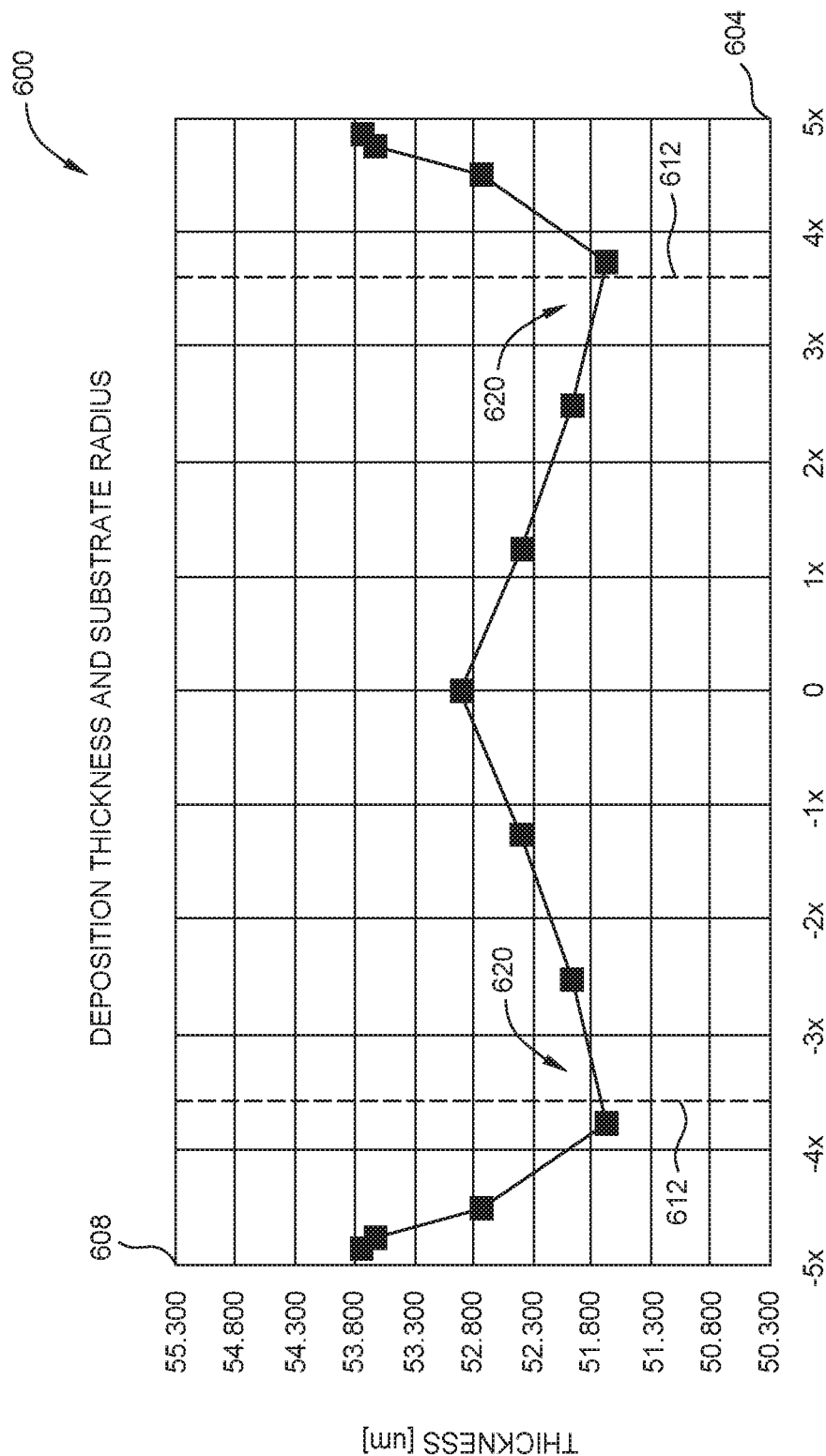
FIG. 6 is a graph depicting deposition thickness as it relates to a radius of the substrate processed in the processing chamber of FIG. 1 according to an embodiment.

FIG. 6 is a graph 600 depicting deposition thickness as it relates to radius of the substrate processed in the processing chamber 100. The graph 600 has an x-axis 604 depicting a substrate radius and a y-axis 608 depicting a deposition thickness. The graph 600 was acquired from the processing chamber 100 having the heat shield assembly 160 with the arc-shaped aperture 232 positioned proximate the gas outlet 178. A deposition uniformity across the substrate 108 corresponds to the position of arc-shaped aperture 232. As previously discussed, reducing the pressure variance 332 at the arc-shaped aperture 232 increases the azimuthal pressure profile of the processing gasses across the substrate 108. As shown in FIG. 2, the substrate 108 has a given substrate radius 240.

A variable x, depicted in an abscissa, i.e., x-axis 604, of the graph 600, is a multiplier for the number of process runs in the graph and can be greater than or equal to 6 and less than 12. For example, for x=10, the identifiers on the x-axis 604 would read 20, 40, 60, etc. When the radius is less than or equal to 4x, deposition uniformity across the substrate 108 was observed within a given range. However, when the radius is greater than 4x, a reduction in deposition uniformity across the substrate 108 was observed.

When the substrate radius 240 is less than or equal to a threshold 612, the heat shield assembly 160 reduces unwanted deposition of material on internal surfaces of the lower dome 114, upper dome 128, and liner 163. In one example, the ratio 620 of a width of the gap 420 to the substrate radius 240 is about 1 to about 3 (i.e. 1/3 or 0.33). The ratio 620 may also be 6 to 5, or about 1.2. The ratio 620 may also include values between 0.33 and 1.2, each of which increases the uniformity of deposition material that are deposited on substrate 108. However, as the substrate radius increases beyond the threshold 612, deposition of material on those internal surfaces begins to increase.

As described above with regards to FIGS. 2 and 3, the pressure variance 332 at the annular opening 134 between the processing volume 111 and the purge volume 113 corresponds to the position of the arc-shaped aperture 232 within the processing chamber 100.

The uniformity of deposition material on the substrate 108 is increased among multiple process runs in the processing chamber 100. In this example, a variable x, is a multiplier for the number of process runs in the graph. Variable x can be greater than or equal to 2 and less than 10. For example, for x=2, the identifiers would read 2, 4, 6, 8, etc. An average difference of a deposition thickness between the initial process runs at x and the process run at 5x is about 0.05 µm. This same average difference of 0.05 µm is observed between the initial process runs at x and the final process runs at 7x. The variance of the average deposition thickness from the initial process runs at x to the final process runs at 7x is about 0.0408. In this example, there is about 0.08% average difference between the initial process runs at x and the final process runs at 7x. Stated differently, the heat shield assembly 160 having the arc-shaped aperture 232 enables uniformity of deposition up to 0.08% for at least 7x process runs.

The disclosure relates to a heat shield assembly for a processing chamber. While the foregoing is directed to specific examples, other examples may be devised without departing from the basic scope thereof, and the scope thereof is determined by the claims that follow.

What we claim is:

1. A processing chamber, comprising:
    a chamber body having sidewalls, a bottom and a lid defining an interior volume of the chamber body;
    a heat shield assembly disposed in the interior volume, the heat shield assembly comprising:
        a heat shield member;
        an annular preheat member having an inner circumference, wherein the annular preheat member is positioned below the heat shield member;
    a susceptor disposed in the interior volume and configured to support a substrate thereon, the susceptor positioned within the inner circumference of the annular preheat member; and
    an annular opening between the susceptor and the annular preheat member, wherein:
        a first section of the annular opening proximate a gas inlet, the first section covered by the heat shield member, and
        a second section of the annular opening proximate a gas outlet, the second section not covered by the heat shield member, wherein the second section is an arc that extends from a first edge and a second edge of the heat shield member.

2. The processing chamber of claim 1, wherein an inner radius of the annular preheat member is larger than an inner radius of the heat shield member.

3. The processing chamber of claim 1, comprising:
a substrate support configured to support a substrate having a radius;
a gap formed in the heat shield member, the gap having a width; and
a ratio of the width to the radius is greater than or equal 0.3.

4. The processing chamber of claim 1, wherein a position of the arc within the processing chamber influences a coating on the bottom side of the susceptor.

5. The processing chamber of claim 4, wherein the position of the arc within the processing chamber influences a coating on an upper dome or lower dome of the processing chamber.

6. The processing chamber of claim 1, wherein
a position of the arc within the processing chamber is configured to influence a thickness uniformity of a deposition material on a substrate.

7. The processing chamber of claim 6, wherein the thickness uniformity of the deposition material on the substrate has a standard deviation less than or equal to 0.75%, between a center of the substrate and an outer radius of the substrate.

8. The processing chamber of claim 1, wherein
a position of the arc within the processing chamber corresponds to a first range of deposition thickness within a first radius of the substrate, and a second range of deposition thickness within a second radius of the substrate, the first range of deposition thickness is less than a second range of deposition thickness.

9. A processing chamber, comprising:
a chamber body having sidewalls, a bottom and a lid defining an interior volume of the chamber body;
a heat shield assembly disposed in the interior volume, the heat shield assembly comprising:
a heat shield member;
an annular preheat member having an inner circumference, wherein the annular preheat member is positioned below the heat shield member;
a susceptor disposed in the interior volume and configured to support a substrate thereon, the susceptor positioned within the inner circumference of the annular preheat member; and
an annular opening between the susceptor and the annular preheat member, wherein:
a first section of the annular opening proximate a gas inlet, the first section covered by the heat shield member, and a second section of the annular opening proximate a gas outlet, the second section not covered by the heat shield member, wherein the heat shield member has a gap that subtends an angle of the heat shield member, wherein edges of the annular opening are parallel to a radius of the heat shield member that bisects the angle, and the annular preheat member includes a recessed portion that receives the heat shield member.

10. A processing chamber, comprising:
a chamber body having sidewalls, a bottom and a lid defining an interior volume of the chamber body;
a heat shield assembly disposed in the interior volume, the heat shield assembly comprising:
a heat shield member, wherein the heat shield member has a gap that subtends an angle of the heat shield member;
an annular preheat member having an inner circumference, wherein the annular preheat member is positioned below the heat shield member, and the annular preheat member includes a recessed portion that receives the heat shield member;
a susceptor disposed in the interior volume and configured to support a substrate thereon, the susceptor positioned within the inner circumference of the annular preheat member; and
an annular opening between the susceptor and the annular preheat member, wherein edges of the annular opening are parallel to a radius of the heat shield member that bisects the angle, and wherein:
a first section of the annular opening proximate a gas inlet, the first section covered by the heat shield member, and
an arc-shaped aperture of the annular opening proximate a gas outlet, the arc-shaped aperture not covered by the heat shield member; a position of the arc-shaped aperture within the processing chamber influences a coating on the bottom side of the susceptor or the sidewalls of the processing chamber.

11. The processing chamber of claim 10, wherein an inner radius of the annular preheat member is larger than an inner radius of the heat shield member.

12. The processing chamber of claim 10, comprising:
a substrate support configured to support a substrate having a radius;
a gap formed in the heat shield member, the gap having a width; and
a ratio of the width to the radius is greater than or equal 0.3.

13. A processing chamber, comprising:
a chamber body having sidewalls, a bottom and a lid defining an interior volume of the chamber body;
a heat shield assembly disposed in the interior volume, the heat shield assembly comprising:
a heat shield member;
an annular preheat member having an inner circumference, wherein the annular preheat member is positioned below the heat shield member;
a susceptor disposed in the interior volume and configured to support a substrate thereon, the susceptor positioned within the inner circumference of the annular preheat member; and
an annular opening between the susceptor and the annular preheat member, wherein:
a first section of the annular opening proximate a gas inlet, the first section covered by the heat shield member, and
an arc-shaped aperture of the annular opening proximate a gas outlet, the arc-shaped aperture not covered by the heat shield member; a position of the arc-shaped aperture within the processing chamber influences a coating on the bottom side of the susceptor or the sidewalls of the processing chamber, and wherein the arc-shaped aperture extends from a first edge and a second edge of the heat shield member.

14. A processing chamber, comprising:
a chamber body having sidewalls, a bottom and a lid defining an interior volume of the chamber body;
a heat shield assembly disposed in the interior volume, the heat shield assembly comprising:
a heat shield member;
an annular preheat member having an inner circumference, wherein the annular preheat member is positioned below the heat shield member;

a susceptor disposed in the interior volume and configured to support a substrate thereon, the susceptor positioned within the inner circumference of the annular preheat member; and an annular opening between the susceptor and the annular preheat member, wherein:
  a first section of the annular opening proximate a gas inlet, the first section covered by the heat shield member, and
  an arc-shaped aperture of the annular opening proximate a gas outlet, the arc-shaped aperture not covered by the heat shield member; a position of the arc-shaped aperture within the processing chamber influences a coating on the bottom side of the susceptor or the sidewalls of the processing chamber, and wherein the position of the arc-shaped aperture within the processing chamber influences a coating on the bottom side of the susceptor.

15. A processing chamber, comprising:
a chamber body having sidewalls, a bottom and a lid defining an interior volume of the chamber body;
a heat shield assembly disposed in the interior volume, the heat shield assembly comprising:
  an heat shield member;
  an annular preheat member having an inner circumference, wherein the annular preheat member is positioned below the heat shield member;
a susceptor disposed in the interior volume and configured to support a substrate thereon, the susceptor positioned within the inner circumference of the annular preheat member; and
an annular opening between the susceptor and the annular preheat member, wherein:
  a first section of the annular opening proximate a gas inlet, the first section covered by the heat shield member, and
  a second section of the annular opening proximate a gas outlet, the second section not covered by the heat shield member, wherein the second section is an arc that extends from a first edge and a second edge of the heat shield member, and wherein the position of the an annular opening with respect to the gas outlet influences a coating on an upper dome or lower dome of the processing chamber.

16. The processing chamber of claim 15, wherein
the position of the annular opening within the processing chamber is configured to influence a thickness uniformity of a deposition material on a substrate.

17. The processing chamber of claim 16, wherein the thickness uniformity of the deposition material on the substrate has a standard deviation less than or equal to 0.75%, between a center of the substrate and an outer radius of the substrate.

18. The processing chamber of claim 15, wherein
the position of the annular opening within the processing chamber corresponds to a first range of deposition thickness within a first radius of the substrate, and a second range of deposition thickness within a second radius of the substrate, the first range of deposition thickness is less than a second range of deposition thickness.

* * * * *